(12) United States Patent
Li et al.

(10) Patent No.: US 10,158,350 B1
(45) Date of Patent: Dec. 18, 2018

(54) LEVEL SHIFTER CIRCUIT FOR GATE DRIVING OF GATE CONTROL DEVICE (71) Applicants: University of Electronic Science and Technology of China, Chengdu (CN); Institute of Electronic and Information Engineering of UESTC in Guangdong, Dongguan (CN)

(72) Inventors: Zehong Li, Chengdu (CN); Xiao Zeng, Chengdu (CN); Yuzhou Wu, Chengdu (CN); Jiali Wan, Chengdu (CN)

(73) Assignees: UNIVERSITY OF ELECTRONIC SCIENCE AND TECHNOLOGY OF CHINA, Chengdu (CN); INSTITUTE OF ELECTRONIC AND INFORMATION ENGINEERING OF UESTC IN GUANGDONG, Dongguan (CN)

( * ) Notice: Subject to any disclaimer, the term of this patent is extended or adjusted under 35 U.S.C. 154(b) by 0 days.

(21) Appl. No.: 15/960,573

(22) Filed: Apr. 24, 2018

(30) Foreign Application Priority Data

Sep. 26, 2017 (CN) .......................... 2017 1 0880016

(51) Int. Cl.
| | | |
|---|---|---|
| *H03K 5/08* | (2006.01) | |
| *H03K 3/3565* | (2006.01) | |
| *H03K 3/012* | (2006.01) | |
| *H03K 5/04* | (2006.01) | |
| *H02M 1/08* | (2006.01) | |
| *H03K 19/20* | (2006.01) | |

(52) U.S. Cl.
CPC ............. *H03K 5/084* (2013.01); *H03K 3/012* (2013.01); *H03K 3/3565* (2013.01); *H03K 5/04* (2013.01); *H02M 1/08* (2013.01); *H03K 19/20* (2013.01)

(58) Field of Classification Search
CPC ........ H03K 5/084; H03K 5/04; H03K 3/3565; H03K 3/012; H03K 19/20; H03K 19/0175; H02M 1/08
See application file for complete search history.

(56) References Cited

U.S. PATENT DOCUMENTS

| | | | | |
|---|---|---|---|---|
| 6,316,956 | B1 * | 11/2001 | Oglesbee .............. | H02J 7/0029 |
| | | | | 323/225 |
| 6,501,321 | B2 * | 12/2002 | Kumagai ............... | H03K 17/14 |
| | | | | 327/333 |
| 9,362,917 | B1 * | 6/2016 | Lee ................ | H03K 19/018528 |
| 2002/0145918 | A1 * | 10/2002 | Maayan ................. | G11C 7/062 |
| | | | | 365/189.07 |

* cited by examiner

*Primary Examiner* — Jung Kim
(74) *Attorney, Agent, or Firm* — Gokalp Bayramoglu (57) ABSTRACT

The double pulse generator of the level shifter circuit takes out the rising edge and falling edge of the pulse width modulation signal PWM_H and generates corresponding narrow pulse signals. The two narrow pulse signals respectively pass through the pulse shaper to control the two field effect transistors in the switching circuit. The pulse width of the narrow pulse signal is not enough to completely switch on the two field effect transistors, so the generated waveform is a sawtooth wave; the drains of the two field effect transistors are respectively connected to the hysteresis-adjustable Schmidt trigger to restore the narrow pulse signal to the rising edge and falling edge pulse signal of the pulse width modulation signal PWM_HS with respect to the floating side VS, and then the signal is restored to the level-shifted pulse width modulation signal PWM HS after passing through the RS latch.

8 Claims, 7 Drawing Sheets

LEVEL SHIFTER CIRCUIT FOR GATE DRIVING OF GATE CONTROL DEVICE

CROSS REFERENCE TO RELATED APPLICATIONS

This application is based upon and claims priority to Chinese Patent Application No. 201710880016.X, filed on Sep. 26, 2017, the entire contents of which are incorporated herein by reference.

TECHNICAL FIELD

The invention belongs to the field of power electronics technology, specifically relates to a level shifter circuit for gate driving of a gate control device.

BACKGROUND

Gate control devices, such as power field effect transistor and insulated gate bipolar transistors (IGBTs), are widely used as power conversion core devices, especially in aspects of power generation, transmission and power transformation. With the development of power device technology, the switching frequency of gate control devices is getting higher and higher, especially in wide bandgap semiconductor devices made of materials like SiC and GaN; and the switching speed, withstand voltage, on-resistance, power density and other performance parameters have been significantly improved compared to the devices made of Si, which has led to the advancement of power conversion system technology. The size has also become smaller as the performance has been improved. At the same time, with the increase of its switching speed, it is necessary to carry out supporting research on its gate drive technology, and the level shifting technology is very important in the half-bridge or full-bridge drive circuit, which realizes the low voltage driving signal to ground shifting to a level that is at the floating side relative to the drain or collector voltage of the lower tube in the half-bridge or full-bridge, and achieves sufficient voltage and power to drive the gate of the upper tube. In a general half-bridge or full-bridge system, the voltage of the floating side is hundreds or several hundreds of volts. Currently, the level shifter circuit in this kind of application can handle a low pulse frequency and cannot adapt to the switching frequency requirement of the new device, at the same time, its own power consumption is large. This requires a new type of level shifter circuit to achieve the performance requirements of high speed, high voltage and low power consumption.

SUMMARY

The purpose of the present invention is to provide a level shifter circuit for gate driving of a gate control device based on the above applications and requirements.

The circuit has the advantages of high speed, high voltage, low power consumption, integration, etc., and satisfies the requirements of high-speed gate drive, floating-side high voltage and low power consumption and so on.

Figure 1:
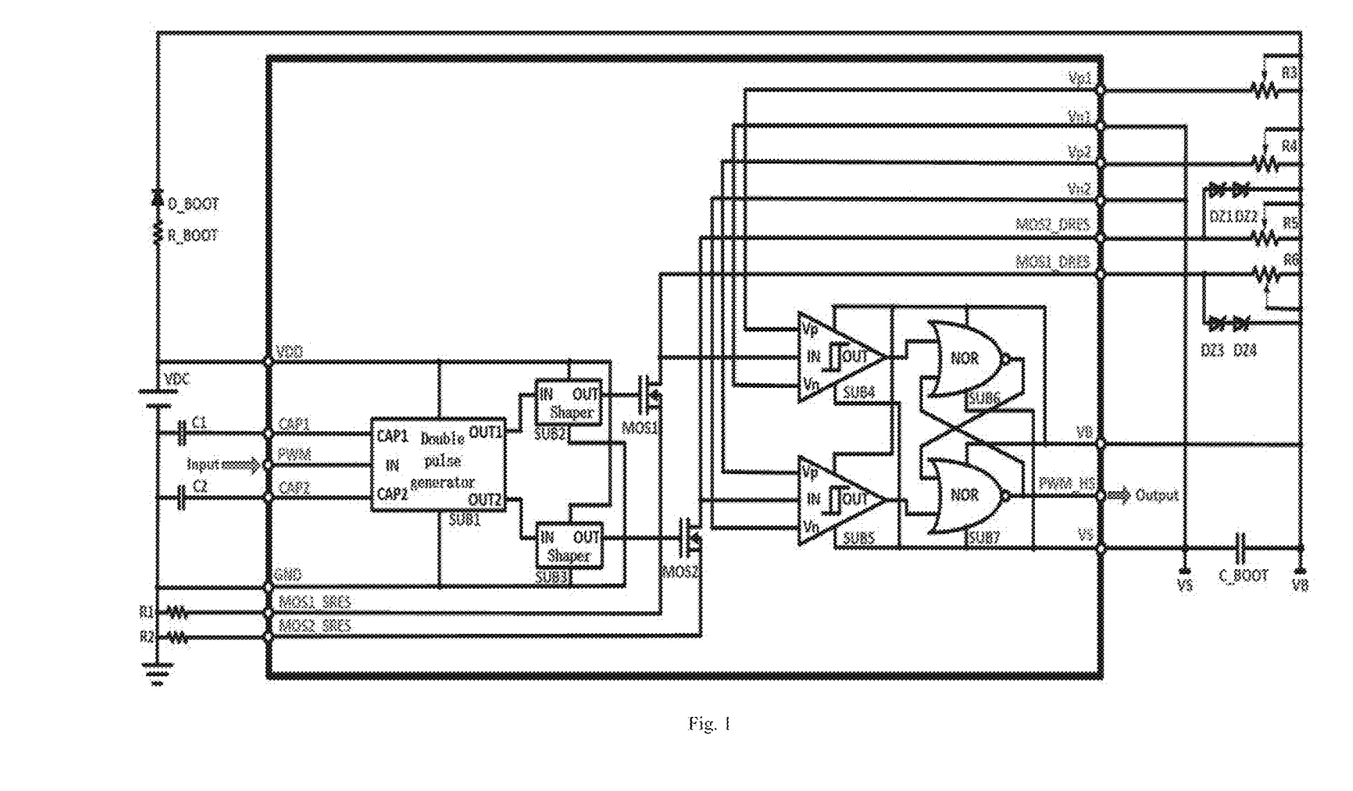
FIG. 1 is a schematic structural diagram of a level shifter circuit for gate driving of a gate control device provided by the present invention.

The technical scheme of the invention is as follows:

A level shifter circuit for gate driving of a gate control device includes a double pulse generator SUB1, an input end of the double pulse generator SUB1 is used as an input end of the level shifter circuit; a first pulse shaper SUB2; an input end of the first pulse shaper SUB2 connects to a first output end of the double pulse generator SUB1; a second pulse shaper SUB3, an input end of the second pulse shaper SUB3 connects to a second output end of the double pulse generator SUB1; a switching circuit including a first metal-oxide semiconductor field effect transistor MOS1 and a second metal-oxide semiconductor field effect transistor MOS2, the gate of the first metal-oxide semiconductor field effect transistor MOS1 connects to the output end of the first pulse shaper SUB2, the gate of the second metal-oxide semiconductor field effect transistor MOS2 connects to the output end of the second pulse shaper (SUB3); a first source pull-down resistor configuring port MOS1_SRES connecting to the source of the first metal-oxide semiconductor field effect transistor MOS1; a second source pull-down resistor configuring port MOS2_SRES connecting to the source of the second metal-oxide semiconductor field effect transistor MOS2; a first Schmitt trigger SUB4, an input end of the first Schmitt trigger SUB4 connects to the drain of the first metal-oxide semiconductor field effect transistor MOS1; a second Schmitt trigger SUB5, an input end of the second Schmitt trigger SUB5 connects to the drain of the second metal-oxide semiconductor field effect transistor MOS2; a RS latch, R input end of the RS latch connects to the output end of the second Schmitt trigger SUB5, the S input end of the second Schmitt trigger SUB5 connects to the output end of the first Schmitt trigger SUB4, output end of the RS latch is used as output end of the level shifter circuit; a first drain pull-up resistor configuring port MOS1_DRES connecting to the drain of the first metal-oxide semiconductor field effect transistor MOS1; a second drain pull-up resistor configuring port MOS2_DRES connecting to the drain of the second metal-oxide semiconductor field effect transistor MOS2.

Specifically, the level shifter circuit further includes a first capacitor configuring port connected to a first pulse width adjusting end of the double pulse generator SUB1; a second capacitor configuring port connected to a second pulse width adjusting end of the double pulse generator SUB1; a switch-on threshold voltage configuring port of the first Schmitt trigger Vp1 connected to the switch-on threshold voltage adjusting end of the first Schmitt trigger SUB4; a switch-on threshold voltage configuring port of the second Schmitt trigger Vp2 connected to the switch-on threshold voltage adjusting end of the second Schmitt trigger SUB5; a switch-off threshold voltage configuring port of the first Schmitt trigger Vn1 connected to the switch-off threshold voltage adjusting end of the first Schmitt trigger SUB4; a switch-off threshold voltage configuring port of the second Schmitt trigger Vn2 connected to the switch-off threshold voltage adjusting end of the second Schmitt trigger SUB5; a floating side connected to the ground terminals of the first Schmitt trigger SUB4, the second Schmitt trigger SUB5, the RS latch, the switch-off threshold voltage configuring port of the first Schmitt trigger Vn1 and the switch-off threshold voltage configuring port of the second Schmitt trigger Vn2; a bootstrap voltage port VB connected to the power supply ends of the first Schmitt trigger SUB4, the second Schmitt trigger SUB5 and the RS latch; a power supply end VDD with a voltage value equal to the low-voltage end supply voltage VDC connected to the power supply ends of the double pulse generator SUB1, the first pulse shaper SUB2 and the second pulse shaper SUB3; the ground end GND connected to the ground terminals of the double pulse generator SUB1, the first pulse shaper SUB2 and the second pulse shaper SUB3.

Specifically, the bootstrap voltage port VB is connected to the target voltage of the level shifter circuit, i.e., the floating side VS is connected to a reference point of the target voltage of the level shifter circuit.

Specifically, the level shifter circuit is connected with an external circuit, and the external circuit includes a first capacitor C1, one end of the first capacitor C1 is connected to a first capacitor configuring port, and the other end of the first capacitor C1 is grounded; a second capacitor C2, one end of the second capacitor C2 is connected to a second capacitor configuring port, the other end of the second capacitor C2 is grounded; a first potentiometer R1, one end of the first potentiometer R1 is connected to the first source pull-down resistor configuring port MOS1_SRES, the other end of the first potentiometer R1 is grounded; a second potentiometer R2, one end of the second potentiometer R2 is connected to the second source pull-down resistor configuring port MOS2_SRES, the other end of the second potentiometer R2 is grounded; a third potentiometer R3, one end of the third potentiometer R3 is connected to the switch-on threshold voltage configuring port of the first Schmitt trigger Vp1, the other end of the third potentiometer R3 is connected to the bootstrap voltage; a fourth potentiometer R4, one end of the fourth potentiometer R4 is connected to the switch-on threshold voltage configuring port of the second Schmitt trigger Vp2, the other end of the fourth potentiometer R4 is connected to the bootstrap voltage; a fifth potentiometer R5, one end of the fifth potentiometer R5 is connected to the second drain pull-up resistor configuring port MOS2_DRES, the other end of the fifth potentiometer R5 is connected to the bootstrap voltage; and a sixth potentiometer R6, one end of the sixth potentiometer R6 is connected to the first drain pull-up resistor configuring port MOS1_DRES, the other end of the sixth potentiometer R6 is connected to the bootstrap voltage.

Specifically, the withstand voltage values of the first metal-oxide semiconductor field effect transistor MOS1 and the second metal-oxide semiconductor field effect transistor MOS2 are greater than the bootstrap voltage, and the withstand voltage values of the first Schmitt trigger SUB4 and the second Schmitt trigger SUB5 are greater than the difference between the bootstrap voltage and the voltage of the floating side VS.

Specifically, the RS latch includes a first NOR gate SUB6 and a second NOR gate SUB7. A first input end of the first NOR gate SUB6 functions as an S input end of the RS latch, and an output end of the first NOR gate SUB6 connects a first input end of the second NOR gate SUB7; a second input end of the second NOR gate SUB7 is used as an R input end of the RS latch, and an output end of the second NOR gate SUB7 is connected to a second input end of the first NOR gate SUB6 and functions as an output end of the RS latch.

Specifically, the withstand voltage values of the first NOR gate SUB6 and the second NOR gate SUB7 are greater than the difference between the bootstrap voltage and the voltage of the floating side VS.

Specifically, the branches where the first metal-oxide semiconductor field effect transistor MOS1 and the second metal-oxide semiconductor field effect transistor MOS2 are located, include two or more filed effect transistors connected in parallel.

The working process of the invention is as follows:

The input end of the level shifter circuit is connected to the pulse width modulation signal PWM_H with respect to the ground, and the rising edge and the falling edge of the pulse width modulation signal PWM_H are taken out to generate a corresponding narrow pulse signal. The pulse width of the narrow pulse signal is determined by the first capacitor C1 and the second capacitor C2.

Then, the narrow pulse signals corresponding to the rising edge and the falling edge generated by the double pulse generator SUB1 are respectively shaped and processed by the first pulse shaper SUB2 and the second pulse shaper SUB3 to receive the gates of the first metal-oxide semiconductor field effect transistor MOS1 and the second metal-oxide semiconductor field effect transistor MOS2, respectively, which control the switching of the first metal-oxide semiconductor field effect transistor MOS1 and the second metal-oxide semiconductor field effect transistor MOS2.

The drains of the first metal-oxide semiconductor field effect transistor MOS1 and the second metal-oxide semiconductor field effect transistor MOS2 are pulled up to the bootstrap voltage through the fifth potentiometer R5 and the sixth potentiometer R6, respectively, and the sources thereof are pulled down to the ground respectively through the first potentiometer R1 and the second potentiometer R2. The first potentiometer R1 and the fifth potentiometer R5 are used to limit the branch current after switching on the first metal-oxide semiconductor field effect transistor MOS1. The second potentiometer R2 and the sixth potentiometer R6 are used to limit the branch current after switching on the second metal-oxide semiconductor field effect transistor MOS2. In addition, the first potentiometer R1 and the second potentiometer R2 also limit the gate-source voltages of the first metal-oxide semiconductor field effect transistor MOS1 and the second field effect transistor MOS2. Therefore, in this circuit, the pulse widths of two narrow pulse signals matched by the first capacitor C1 and the second capacitor C2 and generated by the double pulse generator SUB1 are not enough to completely switch on the first metal-oxide semiconductor field effect transistor MOS1 and the second metal-oxide semiconductor field effect transistor MOS2. Instead, make it operate in a linear region so that the switch-on degree of the first metal-oxide semiconductor field effect transistor MOS1 is determined by the first capacitor C 1and the first potentiometer R1, while the switch-on degree of the second metal-oxide semiconductor field effect transistor MOS2 is determined by the second capacitor C2 and the second potentiometer R2.

Since the first metal-oxide semiconductor field effect transistor MOS1 and the second metal-oxide semiconductor field effect transistor MOS2 are not completely switched on, the generated waveform is a sawtooth wave, so that the rising edge and falling edge of the input pulse width modulation signal PWM_H can be respectively transmitted to the drains of the first metal-oxide semiconductor field effect transistor MOS1 and the second metal-oxide semiconductor field effect transistor MOS2.

The drains of the first metal-oxide semiconductor field effect transistor MOS1 and the second metal-oxide semiconductor field effect transistor MOS2 are respectively connected to the hysteresis-adjustable first Schmitt trigger SUB4 and the hysteresis-adjustable second Schmitt trigger SUB5 to restore to pulse signals of rising edge and falling edge of the pulse width modulation signal PWM_HS with respect to the floating side VS. The switch-off threshold is determined by the switch-off threshold adjusting ends Vn of the first Schmitt trigger SUB4 and the second Schmitt trigger SUB5, and are connected to the floating side VS. The switch-on threshold is determined by the switch-on threshold adjusting end Vp, and is connected to the potentiometer R3 or the fourth potentiometer R4 for regulation. The first Schmitt trigger SUB4 and the second Schmitt trigger SUB5 connect the RS latch to restore the signal to the level-shifted pulse width modulation signal PWM_HS.

The beneficial effects of the present invention are as follows: a level shifter circuit is proposed, which provides a novel level shifting method for the gate driving of the gate control device, effectively meeting the requirements of high speed, high voltage, low power consumption and integration.

DETAILED DESCRIPTION

The specific embodiments of the present invention will be described below with reference to the accompanying drawings and specific embodiments.

The gate control device related to the level shifter circuit provided by the present invention may be a gate control device made of materials such as Si, SiC and GaN, and mainly solves the problem of level shifting of upper gate driving in a half-bridge or full-bridge circuit composed of gate control device.

As shown in FIG. 1, a level shifter circuit for gate driving of a gate control device provided by the present invention includes a double pulse generator SUB1, a first pulse shaping circuit SUB2, a second pulse shaping circuit SUB3, and a switching circuit, hysteresis-adjustable first Schmitt trigger SUB4 and second Schmitt trigger SUB5, and a RS latch, the RS latch in this embodiment includes a first NOR gate SUB6 and a second NOR gate SUB7. In the present embodiment, the branch of the first metal-oxide semiconductor field effect transistor MOS1 and the second metal-oxide semiconductor field effect transistor MOS2 includes only one field effect transistor, and in some embodiments, the branch of the first metal-oxide semiconductor field effect transistor MOS1 and the second metal-oxide semiconductor field effect transistor MOS2 in the switching circuit includes two or more field effect transistor connected in parallel.

The double pulse generator is further provided with two capacitor configuring ports connecting external capacitors for configuring the widths of the narrow pulses corresponding to the rising edge and falling edge of the generated pulse width modulation signal PWM_H. The width of the narrow pulse should be smaller than the switch-on time and switch-off time of the switching tube in the switching circuit.

In the level shifter circuit, the power supply end VDD and the ground terminal GND are respectively connected to the power supply and the ground before the level shifting, and the bootstrap voltage port VB and the floating side VS are connected to the target voltage and the reference point of the target voltage after the level shifting, respectively. In the embodiment, a bootstrap circuit is used to generate a bootstrap voltage based on the voltage of the floating side VS. The voltage difference between the bootstrap voltage port VB and the floating side VS is equal to the difference between the power supply end VDD and the ground terminal GND.

Figure 3:
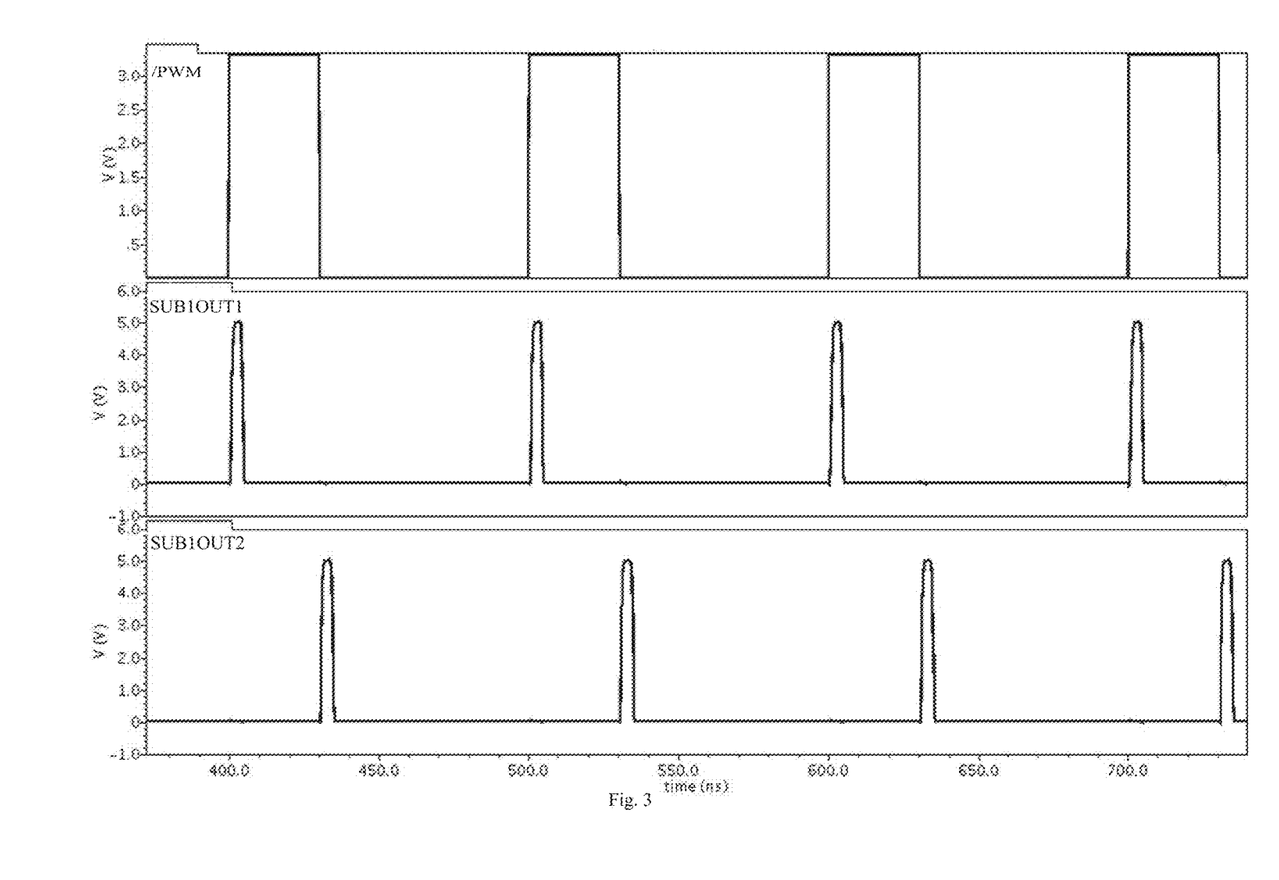
FIG. 3 are input and output waveform diagrams of the double pulse generator SUB1 of the embodiment.
Figure 4:
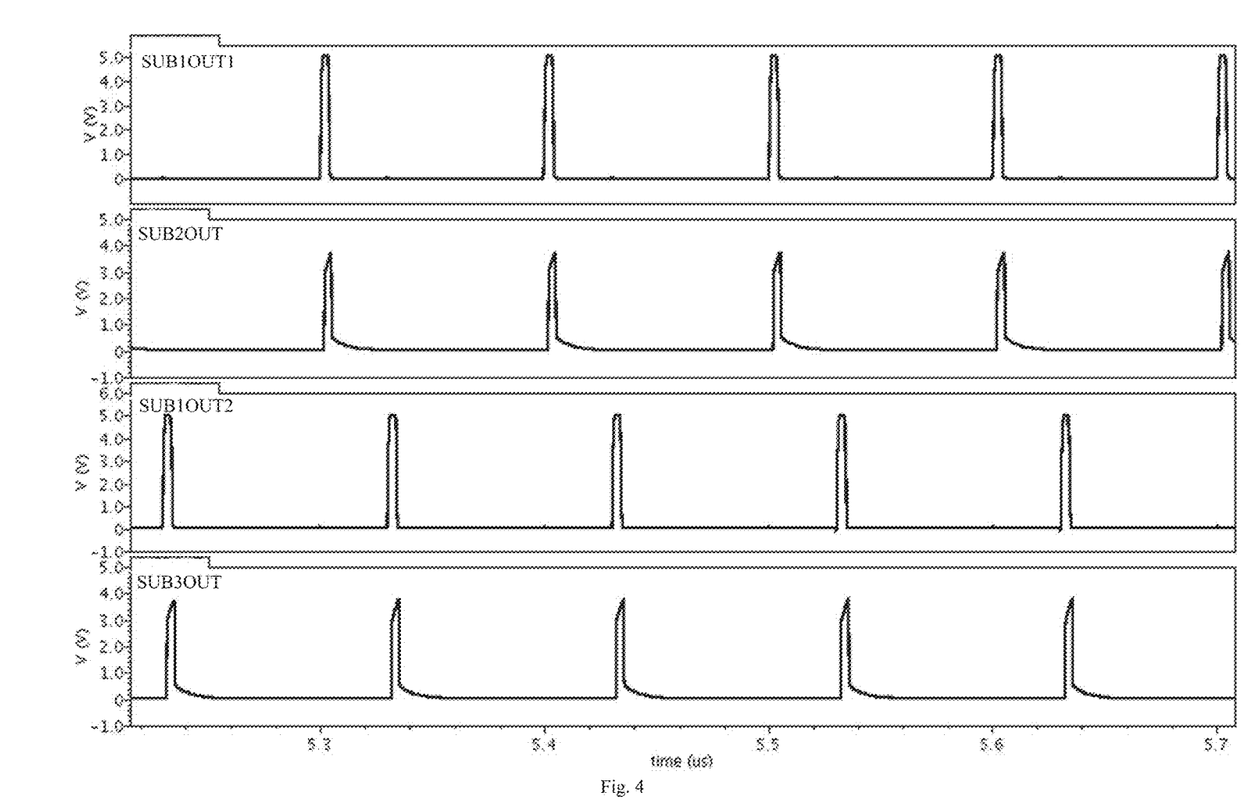
FIG. 4 are input and output waveform diagrams of the first pulse shaper SUB2 and the second pulse shaper SUB3 of the embodiment.

The working process of this embodiment is as follows: the double pulse generator SUB1 receives the pulse width modulation signal PWM_H to be processed as an input, and takes out the rising edge and the falling edge, and narrow pulses respectively corresponding to the rising edge and the falling edge are formed by the first capacitor C1 and the second capacitor C2 respectively, as shown in FIG. 3; these two pulses are shaped and processed by the first pulse shaper SUB2 and the second pulse shaper SUB3, respectively, as shown in FIG. 4; then respectively connected to the gates of the first metal-oxide semiconductor field effect transistor MOS1 and the second metal-oxide semiconductor field effect transistor MOS2 to control the switching, the withstand voltages of the first metal-oxide semiconductor field effect transistor MOS1 and the second metal-oxide semiconductor field effect transistor MOS2 are greater than the voltage of the bootstrap voltage port VB. The pulse widths of two narrow pulses above are not enough to completely switch on the first metal-oxide semiconductor field effect transistor MOS1 and the second metal-oxide semiconductor field effect transistor MOS2, i.e., make it operate in a linear region, thereby the switch-on degree of the first metal-oxide semiconductor field effect transistor MOS1 is determined by the first capacitor C1 and the first potentiometer R1, while the switch-on degree of the second metal-oxide semiconductor field effect transistor MOS2 is determined by the second capacitor C2 and the second potentiometer R2.

The drains of the first metal-oxide semiconductor field effect transistor MOS1 and the second metal-oxide semiconductor field effect transistor MOS2 are respectively connected to the pull-up resistor or the fifth potentiometer R5 and the sixth potentiometer R6 and then pulled up to the bootstrap voltage with respect to the floating side VS, the bootstrap voltage is equal to the voltage of the floating side VS plus the low-voltage supply voltage VDC. Similarly, the sources of the first metal-oxide semiconductor field effect transistor MOS1 and the second metal-oxide semiconductor field effect transistor MOS2 are respectively connected to the pull-down resistor or the first potentiometer R1 and the second potentiometer R2 and then pulled down to the ground. In practical applications, resistance value can be directly used to determine the resistor, and the potentiometer can be used to fine-tune the circuit through actual conditions.

The resistance values of the first potentiometer R1 and the fifth potentiometer R5 are used to limit the branch current of the first metal-oxide semiconductor field effect transistor MOS1 after switching on, and the resistance values of the second potentiometer R2 and the sixth potentiometer R6 are used to limit the branch current of the second metal-oxide semiconductor field effect transistor MOS2 after switching on. The first potentiometer R1 and the second potentiometer R2 can further limit the gate-source voltages of the first metal-oxide semiconductor filed effect transistor MOS1 and the second metal-oxide semiconductor field effect transistor MOS2.

The bootstrap voltage is generally hundreds or several hundreds of volts to ground. Since the first metal-oxide semiconductor field effect transistor MOS1 and the second metal-oxide semiconductor field effect transistor MOS2 are not completely switched on, and pull-up resistors and pull-down resistors are used to limit current, the power consumption of the branches of the first metal-oxide semiconductor field effect transistor MOS1 and the second metal-oxide semiconductor field effect transistor MOS2 is relatively low. In addition, the withstand voltage values of the first metal-oxide semiconductor field effect transistor MOS1 and the second metal-oxide semiconductor field effect transistor MOS2 in this embodiment should be greater than the bootstrap voltage.

Figure 5:
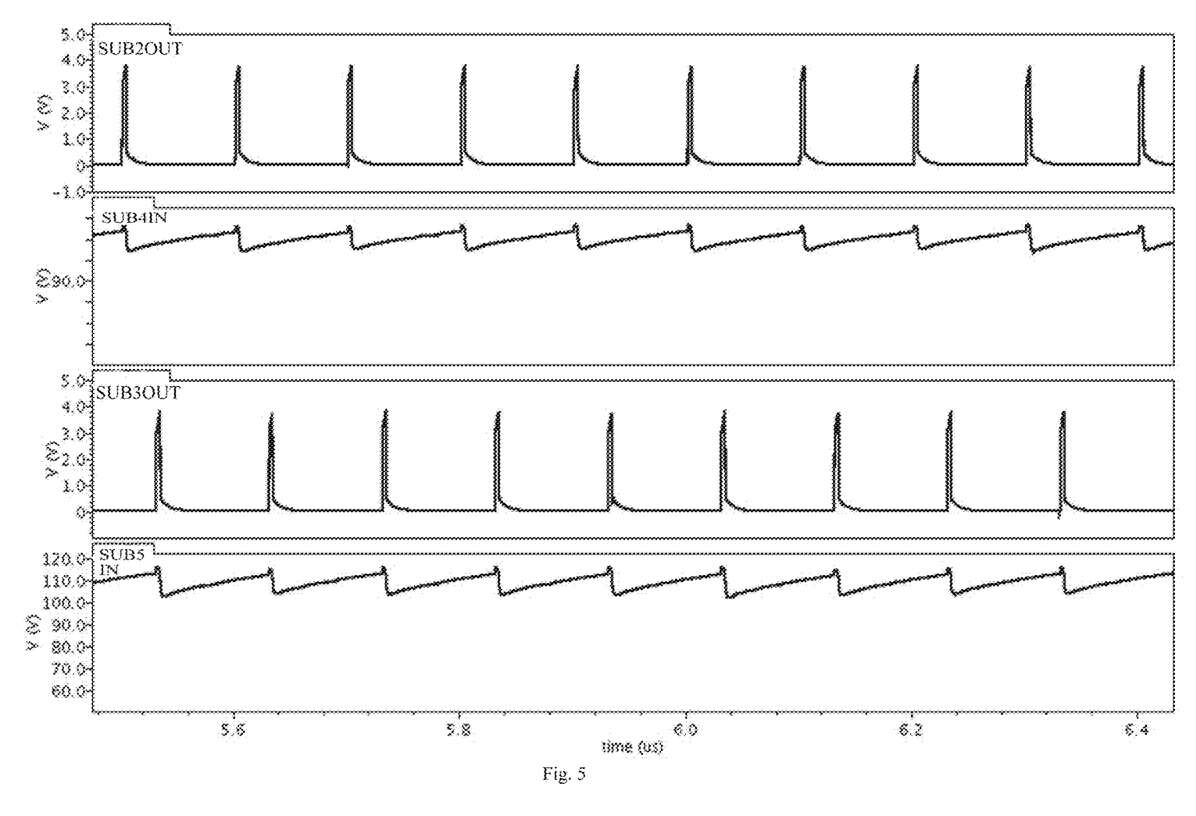
FIG. 5 are waveform diagrams of gates and drains of the first metal-oxide semiconductor field effect transistor MOS1 and the second metal-oxide semiconductor field effect transistor MOS2 of the embodiment.

As shown in FIG. 5, the switching waveform diagrams of the first metal-oxide semiconductor field effect transistor MOS1 and the second metal-oxide semiconductor field effect transistor MOS2 under the action of two narrow pulses are shown. It can be seen that the first metal-oxide semiconductor field effect transistor MOS1 and the second metal-oxide semiconductor field effect transistor MOS2 are not completely switched on. Therefore, the generated waveform is a sawtooth wave, so that the rising edge and falling edge of the input pulse width modulation signal PWM can be respectively transmitted to the drains of the first metal-oxide semiconductor field effect transistor MOS1 and the second metal-oxide semiconductor field effect transistor MOS2.

Figure 6:
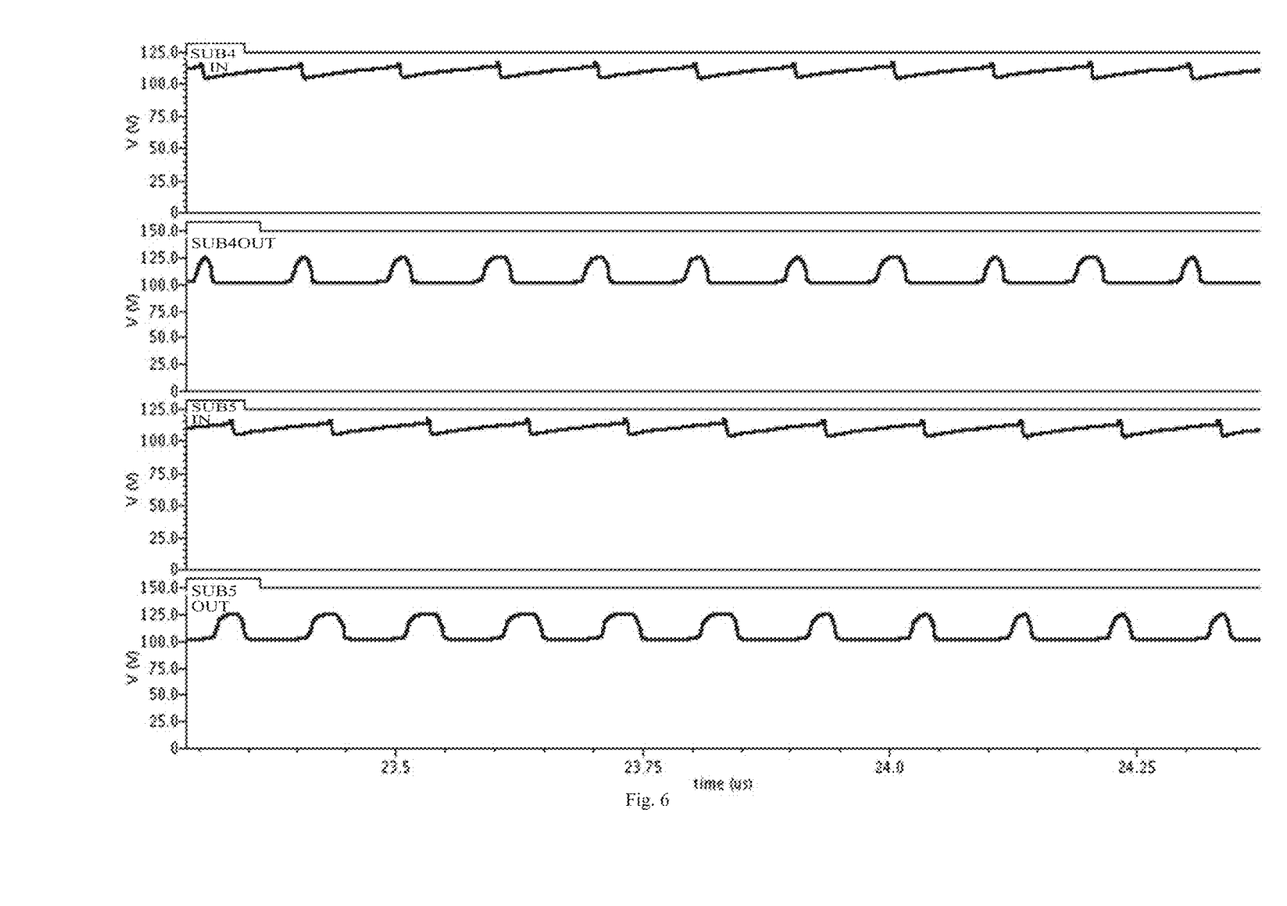
FIG. 6 are input and output waveform diagrams of the first Schmitt trigger SUB4 and the second Schmitt trigger SUB5 of the embodiment.

The sawtooth wave signal is transmitted through the hysteresis-adjustable first Schmitt trigger SUB4 and the second Schmitt trigger SUB5 to generate a square wave with an adjustable pulse width, as shown in FIG. 6, to realize the compensation of the pre-stage circuit for the delay caused by the original signal. The switch-off threshold adjusting end Vn of the first Schmitt trigger SUB4 and the second Schmitt trigger SUB5 determines the switch-off threshold, and are connected to the floating side VS; the switch-on threshold adjusting end Vp determines the switch-on threshold, and are externally connected to the third potentiometer R3 or the fourth potentiometer R4 for adjusting.

Figure 7:
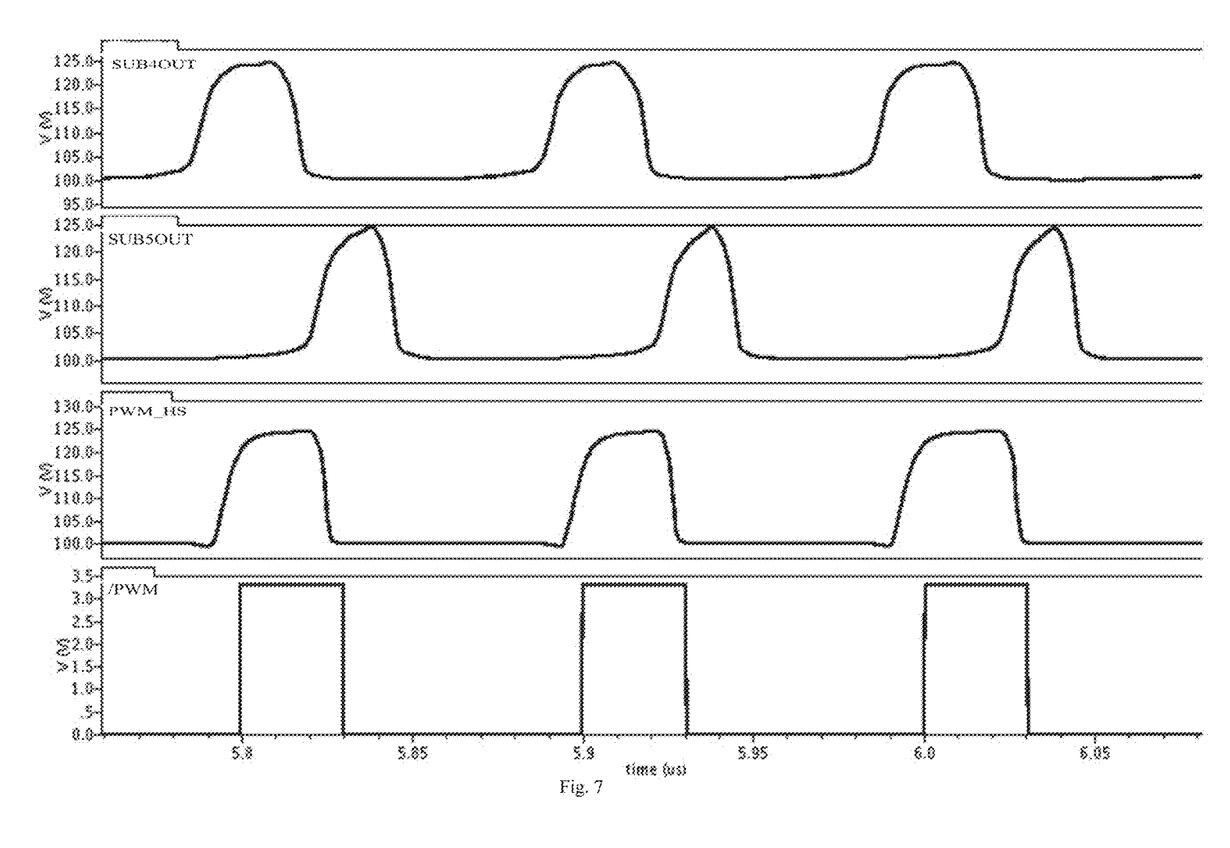
FIG. 7 are input and output waveform diagrams of the RS latch, and a PWM waveform diagram before level shirt of the embodiment.

The two square waves pass through the RS latch to restore to the pulse width modulation signal PWM_HS relative to the floating side VS, as shown in FIG. 7, thereby completing the level shifting. The RS latch in this embodiment includes a first NOR gate SUB6 and a second NOR gate SUB7. The withstand voltage of the first Schmitt trigger SUB4, the second Schmitt trigger SUB5, the first NOR gate SUB6 and the second NOR gate SUB7 in the entire circuit should be greater than the difference between the bootstrap voltage and the floating side VS.

Figure 2:
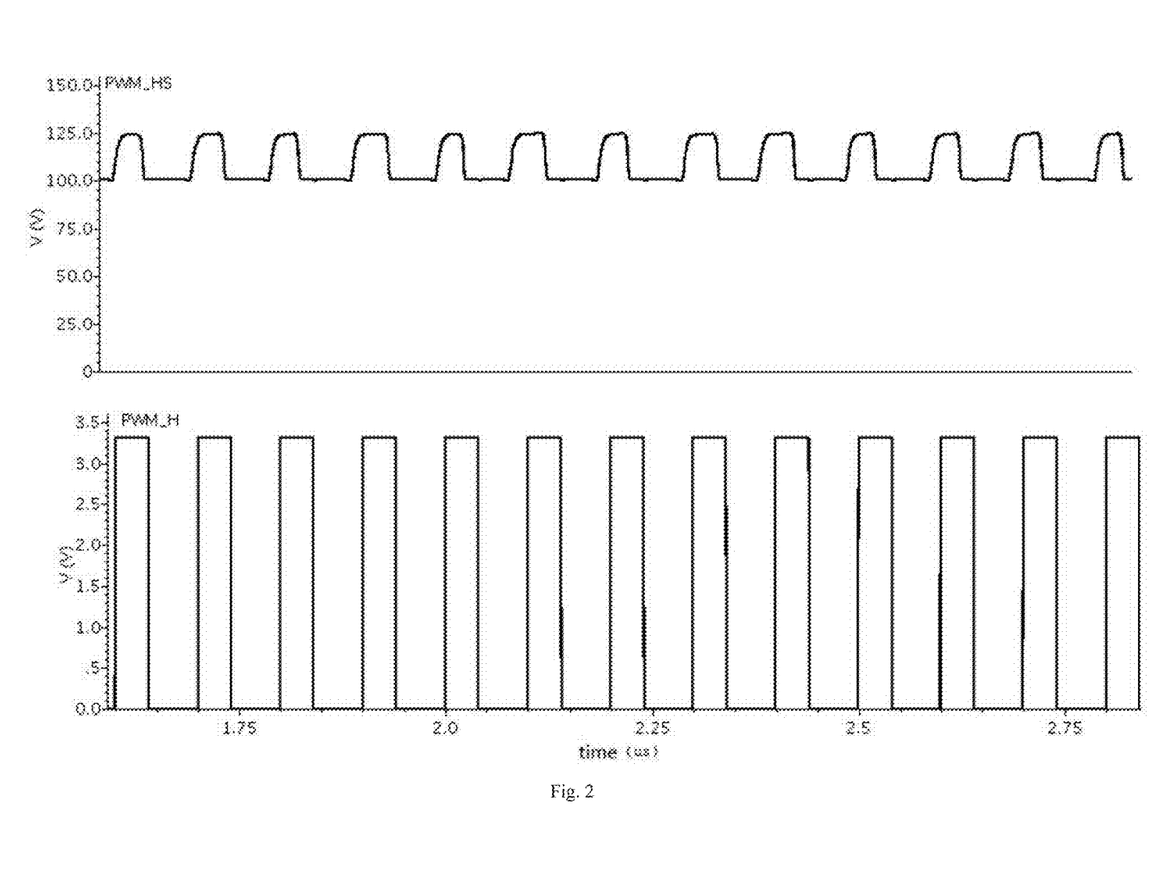
FIG. 2 are input and output waveform diagrams of a level shifter circuit of the embodiment.

FIG. 2 shows the signals before and after the level shift of the embodiment. It can be seen that the level shifter circuit in this embodiment processes a pulse width modulation signal with a frequency of 10 MHz and a high level to ground of 3.3 V to be 10 MHz. The high level is relative to the 24V pulse width modulation signal of 100V floating side VS. In this embodiment, FIG. 2 to FIG. 7 design the key point waveforms of the level shifter circuit of the present invention using a 1 um 700V BCD process, and the processing speed and withstand voltage thereof will continue to increase with the progress of the BCD.

The level shifter circuit provided by the present invention can also be implemented by discrete devices, i.e., can be made into integrated circuit IC or a form of circuit board. The processing speed and withstand voltage are determined by the switching speed and withstand voltage of the used discrete devices.

Those skilled in the art may make various other specific variations and combinations without departing from the essence of the present invention based on these technical disclosures disclosed in the present invention, and these variations and combinations are still within the protection scope of the present invention.

We claim:

1. A level shifter circuit for gate driving of a gate control device, comprising
   a double pulse generator, wherein an input end of the double pulse generator is used as an input end of the level shifter circuit;
   a first pulse shaper, wherein an input end of the first pulse shaper is connected to a first output end of the double pulse generator;
   a second pulse shaper, wherein an input end of the second pulse shaper is connected to a second output end of the double pulse generator;
   a switching circuit comprising a first metal-oxide semiconductor field effect transistor and a second metal-oxide semiconductor field effect transistor; wherein a gate of the first metal-oxide semiconductor field effect transistor is connected to an output end of the first pulse shaper, and a gate of the second metal-oxide semiconductor field effect transistor is connected to an output end of the second pulse shaper;
   a first source pull-down resistor configuring port connected to a source of the first metal-oxide semiconductor field effect transistor;
   a second source pull-down resistor configuring port connected to a source of the second metal-oxide semiconductor field effect transistor;
   a first Schmitt trigger, wherein an input end of the first Schmitt trigger is connected to a drain of the first metal-oxide semiconductor field effect transistor;
   a second Schmitt trigger, wherein an input end of the second Schmitt trigger is connected to a drain of the second metal-oxide semiconductor field effect transistor;
   a RS latch, wherein a R input end of the RS latch connects to an output end of the second Schmitt trigger, a S input end of the RS latch is connected to an output end of the first Schmitt trigger, and an output end of the RS latch is used as an output end of the level shifter circuit;
   a first drain pull-up resistor configuring port connected to the drain of the first metal-oxide semiconductor field effect transistor; and
   a second drain pull-up resistor configuring port connected to the drain of the second metal-oxide semiconductor field effect transistor;
   a first capacitor configuring port connected to a first pulse width adjusting end of the double pulse generator;
   a second capacitor configuring port connected to a second pulse width adjusting end of the double pulse generator;
   a switch-on threshold voltage configuring port of the first Schmitt trigger connected to a switch-on threshold voltage adjusting end of the first Schmitt trigger;
   a switch-on threshold voltage configuring port of the second Schmitt trigger connected to a switch-on threshold voltage adjusting end of the second Schmitt trigger;
   a switch-off threshold voltage configuring port of the first Schmitt trigger connected to a switch-off threshold voltage adjusting end of the first Schmitt trigger;
   a switch-off threshold voltage configuring port of the second Schmitt trigger connected to a switch-off threshold voltage adjusting end of the second Schmitt trigger;
   a floating side connected to ground terminals of the first Schmitt trigger, the second Schmitt trigger, the RS latch, the switch-off threshold voltage configuring port of the first Schmitt trigger and the switch-off threshold voltage configuring port of the second Schmitt trigger;
a bootstrap voltage port connecting to power supply ends of the first Schmitt trigger, the second Schmitt trigger and the RS latch;
a power supply end with a voltage value equal to a low-voltage end supply voltage connected to power supply ends of the double pulse generator, the first pulse shaper and the second pulse shaper; and
a ground end connecting to ground terminals of the double pulse generator, the first pulse shaper and the second pulse shaper.

2. The level shifter circuit for gate driving of the gate control device according to claim 1, wherein the bootstrap voltage port is connected to a bootstrap voltage, and the bootstrap voltage is a target voltage of the level shifter circuit, the floating side is connected to a reference point of the target voltage of the level shifter circuit.

3. The level shifter circuit for gate driving of the gate control device according to claim 2, wherein the level shifter circuit is connected to an external circuit, and the external circuit comprises,
a first capacitor, wherein one end of the first capacitor is connected to a first capacitor configuring port, and the other end of the first capacitor is grounded;
a second capacitor, wherein one end of the second capacitor is connected to a second capacitor configuring port, the other end of the second capacitor is grounded;
a first potentiometer, wherein one end of the first potentiometer is connected to the first source pull-down resistor configuring port, the other end of the first potentiometer is grounded;
a second potentiometer, wherein one end of the second potentiometer is connected to the second source pull-down resistor configuring port, the other end of the second potentiometer is grounded;
a third potentiometer, wherein one end of the third potentiometer is connected to the switch-on threshold voltage configuring port of the first Schmitt trigger, the other end of the third potentiometer is connected to the bootstrap voltage;
a fourth potentiometer, wherein one end of the fourth potentiometer is connected to the switch-on threshold voltage configuring port of the second Schmitt trigger, the other end of the fourth potentiometer is connected to the bootstrap voltage;
a fifth potentiometer, wherein one end of the fifth potentiometer is connected to the second drain pull-up resistor configuring port, the other end of the fifth potentiometer is connected to the bootstrap voltage; and
a sixth potentiometer, wherein one end of the sixth potentiometer is connected to the first drain pull-up resistor configuring port, the other end of the sixth potentiometer is connected to the bootstrap voltage.

4. The level shifter circuit for gate driving of the gate control device according to claim 2, wherein a withstand voltage value of the first metal-oxide semiconductor field effect transistor and a withstand voltage value of the second metal-oxide semiconductor field effect transistor are greater than the bootstrap voltage, and a withstand voltage value of the first Schmitt trigger and a withstand voltage value of the second Schmitt trigger are greater than a difference between the bootstrap voltage and a voltage of the floating side.

5. The level shifter circuit for gate driving of the gate control device according to claim 1, wherein the RS latch comprises a first NOR gate and a second NOR gate; a first input end of the first NOR gate functions as a S input end of the RS latch, and an output end of the first NOR gate connects a first input end of the second NOR gate; a second input end of the second NOR gate is used as a R input end of the RS latch, and an output of the second NOR gate is connected to a second input end of the first NOR gate and functions as an output end of the RS latch.

6. The level shifter circuit for gate driving of the gate control device according to claim 2, wherein the RS latch comprises a first NOR gate and a second NOR gate; a withstand voltage value of the first NOR gate and a withstand voltage value of the second NOR gate are greater than a difference between the bootstrap voltage and a voltage of the floating side.

7. The level shifter circuit for gate driving of the gate control device according to claim 1, wherein branches where the first metal-oxide semiconductor field effect transistor and the second metal-oxide semiconductor field effect transistor are located comprises two or more field effect transistors connected in parallel.

8. The level shifter circuit for gate driving of the gate control device according to claim 5, wherein a withstand voltage value of the first NOR gate and a withstand voltage value of the second NOR gate are greater than a difference between the bootstrap voltage and a voltage of the floating side.

* * * * *